(12) United States Patent
Choi

(10) Patent No.: US 7,595,217 B2
(45) Date of Patent: Sep. 29, 2009

(54) METHOD OF MANUFACTURING A CMOS IMAGE SENSOR

(75) Inventor: Chee Hong Choi, Busan (KR)

(73) Assignee: Dongbu HiTek Co., Ltd., Seoul (KR)

( * ) Notice: Subject to any disclaimer, the term of this patent is extended or adjusted under 35 U.S.C. 154(b) by 209 days.

(21) Appl. No.: 11/614,730

(22) Filed: Dec. 21, 2006

(65) Prior Publication Data

US 2007/0152228 A1  Jul. 5, 2007

(30) Foreign Application Priority Data

Dec. 29, 2005 (KR) .................. 10-2005-0133307

(51) Int. Cl.
*H01L 21/00* (2006.01)
*H01L 31/00* (2006.01)
*G02B 27/10* (2006.01)

(52) U.S. Cl. .............. 438/70; 438/60; 438/66; 438/72; 438/75; 359/619; 359/626; 257/431; 257/432; 257/437; 257/E21.58; 257/E21.582; 257/E27.132; 257/E27.134; 257/E31.128

(58) Field of Classification Search ............ 438/60, 438/66, 70, 75; 359/619, 626; 257/431, 257/432, 437
See application file for complete search history.

(56) References Cited

U.S. PATENT DOCUMENTS

| 6,252,218 | B1 * | 6/2001 | Chou ............. 250/208.1 |
| 2002/0176037 | A1 | 11/2002 | Li |
| 2004/0080008 | A1 * | 4/2004 | Yamamoto ............. 257/432 |
| 2005/0101049 | A1 * | 5/2005 | Kim ............. 438/66 |

FOREIGN PATENT DOCUMENTS

| JP | 2005101090 | 4/2005 |
| KR | 10-2003-0037292 | 5/2003 |

\* cited by examiner

*Primary Examiner*—Dao H Nguyen
(74) *Attorney, Agent, or Firm*—Sherr & Vaughn, PLLC

(57) ABSTRACT

A CMOS image sensor may include at least one of: a semiconductor substrate over which a photodiode and transistors are formed; passivation layers formed over a semiconductor substrate; and color PRs buried in trenches formed in the passivation layers and formed to be higher than the trenches.

20 Claims, 5 Drawing Sheets

METHOD OF MANUFACTURING A CMOS IMAGE SENSOR

The present application claims priority under 35 U.S.C. 119 and 35 U.S.C. 365 to Korean Patent Application No. 10-2005-0133307 (filed on Dec. 29, 2005), which is hereby incorporated by reference in its entirety.

BACKGROUND

FIGS. 1A to 1D illustrate a method of manufacturing a CMOS image sensor. In a method of manufacturing a CMOS image sensor, after a field insulating layer for electric insulation between elements is formed on a silicon substrate and light receiving elements such as a photo diode are formed, an interlayer insulating layer and a pad may be formed.

Passivation layers may be formed in order to protect elements or a pad. As illustrated in FIG. 1A, after applying an undoped silicate glass (USG) layer 100 and a d-tera ethyl ortho silicate (TEOS) layer 110 as passivation layers, a planarization process may be performed. A silicon nitride (SiN) passivation layer 120 may be applied to form passivation layers. USG passivation layer 100 may be applied at a thickness of approximately 10,000 Å and/or SiN passivation layer 120 may be applied at a thickness of approximately 3,000 Å.

As illustrated in FIG. 1B, color filters 130 may be formed by a color photolithography process. As illustrated in FIG. 1C, planarization layer 140 may be formed over color filters 130. As illustrated in FIG. 1D, a thermal reflow may be performed to form convex micro-lenses 150.

A pad passivation layer may be formed to have a thickness of about 15,000 Å. If a pad passivation layer has a thickness of about 15,000 Å (or another thickness that is relatively thick), the sensitivity of light that incident through micro-lenses 150 may be degraded. If color filters 130 and micro-lenses 150 are formed in separate processes, the processes may be complicated.

SUMMARY

Embodiments relate to a method of manufacturing a CMOS image sensor having a relatively high sensitivity to light. In a CMOS device, light may be incident on light receiving elements through micro-lenses. Embodiments relate to relatively simple manufacturing processes of CMOS image sensors.

Embodiments relate to a method of manufacturing a CMOS image sensor, which may include at least one of: forming passivation layers over a semiconductor substrate where a photodiode and transistors are formed; forming photoresist (PR) patterns over a passivation layer; selectively etching PR patterns to form trenches in passivation layers; applying color PRs higher than trenches; and/or applying thermal reflow to color PRs to form color filters and micro-lenses.

A CMOS image sensor may include at least one of: a semiconductor substrate over which a photodiode and transistors are formed; passivation layers formed over a semiconductor substrate; and color PRs buried in trenches formed in the passivation layers and formed to be higher than the trenches.

DETAILED DESCRIPTION

A method of manufacturing a CMOS image sensor, according to embodiments, is illustrated in example FIGS. 2A to 2F. Embodiments relate to a method of forming color filters and micro-lenses in a CMOS image sensor.

Figure 1A:
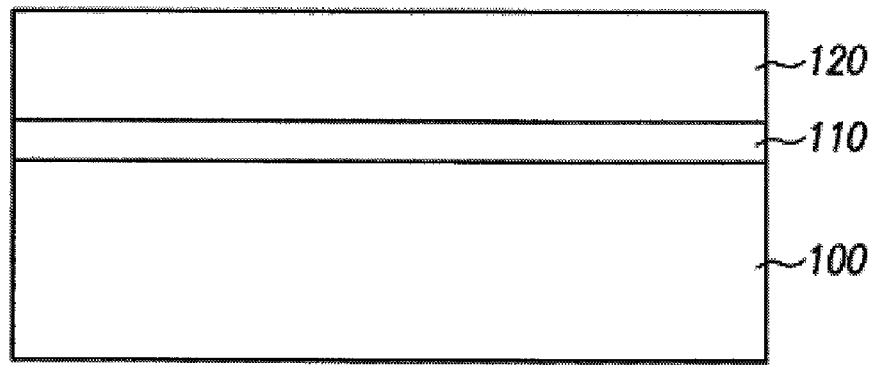
FIGS. 1A to 1D illustrate a method of manufacturing a CMOS image sensor.
Figure 1B:
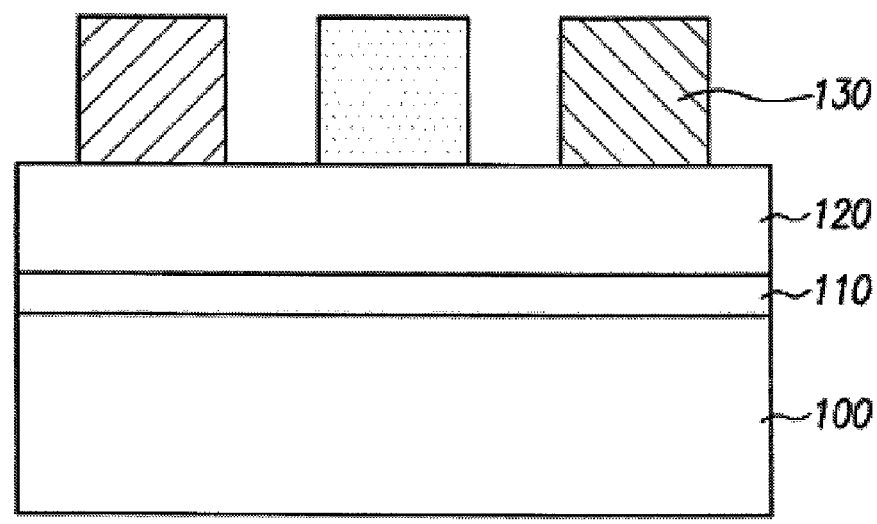
Figure 1C:
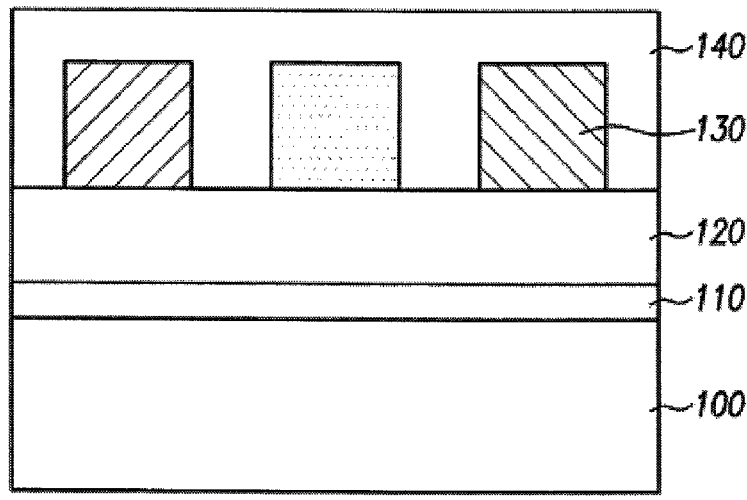
Figure 1D:
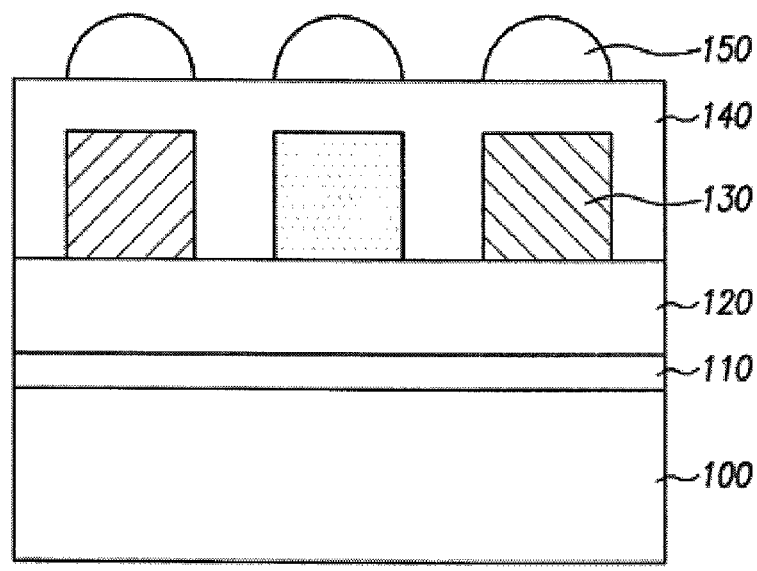
Figure 2A:
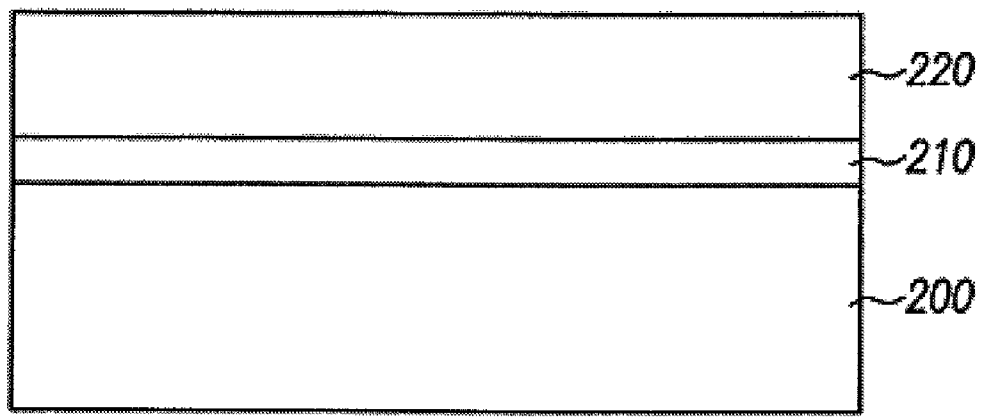
FIGS. 2A to 2F illustrate a method of manufacturing CMOS image sensors, according to embodiments.

As illustrated in FIG. 2A, USG passivation layer 200 and d-TEOS layer 210 are formed over a substrate where a pad is formed, in accordance with embodiments. Planarization of d-TEOS layer 210 may be performed. SiN passivation layer 220 may be formed over d-TEOS layer 210. A photodiode and a transistor may be formed under USG passivation layer 200, d-TEOS passivation layer 210, and/or SiN passivation layer 220.

Figure 2B:
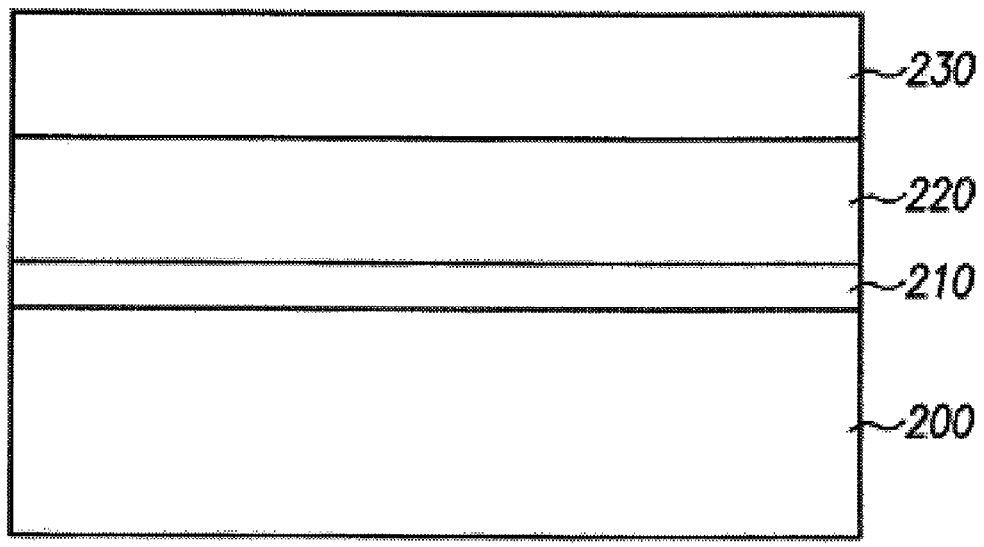
Figure 2C:
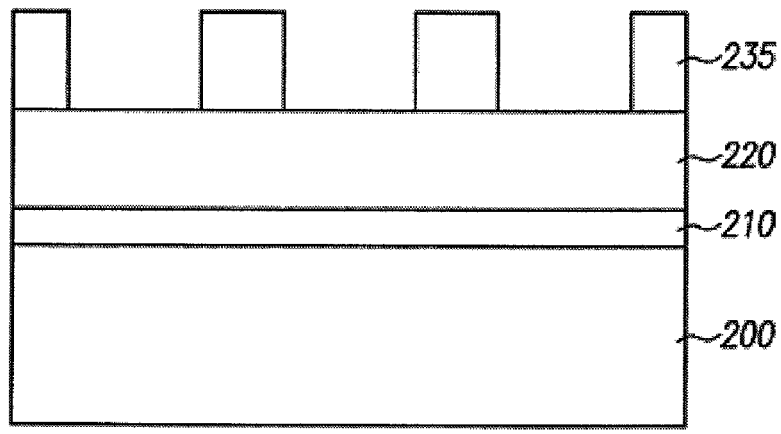
Figure 2D:
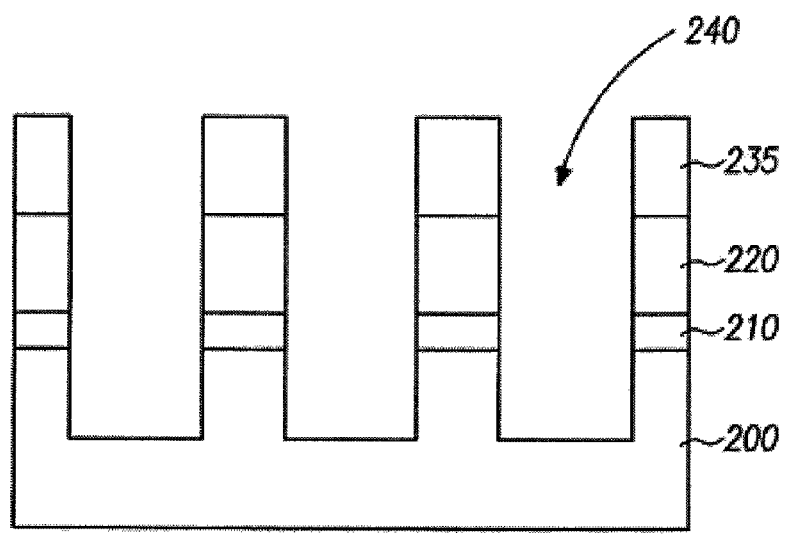

As illustrated in FIG. 2B, photoresist (PR) 230 may be formed, in accordance with embodiments. As illustrated in FIG. 2C, PR patterns 235 may be formed for forming trenches in a photolithography process, in accordance with embodiments. As illustrated in FIG. 2D, an etching process may be performed to form trenches in USG passivation layer 200, d-TEOS passivation layer 210, and/or SiN passivation layer 220, in accordance with embodiments. In embodiments, color PRs 250 may be filled in trenches 240 by a damascene method. PR patterns 235 may be removed.

Figure 2E:
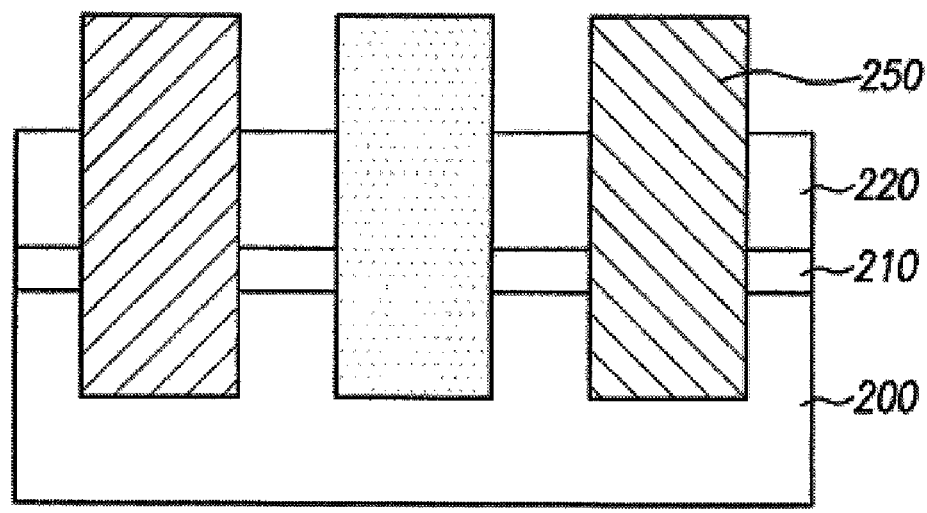

As illustrated in FIG. 2E, color PRs 250 may be formed higher (by a predetermined thickness) than trenches 240, in accordance with embodiments. Color PRs 250 that may fill trenches 240 may be for forming color filters. Color PRs 250 may be formed to be higher than trenches 240 by a predetermined thickness for forming micro-lenses.

Figure 2F:
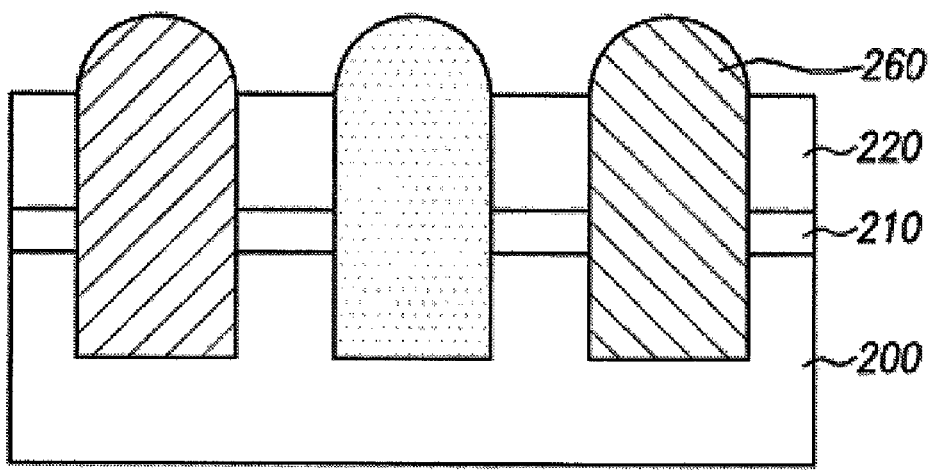

As illustrated in FIG. 2F, thermal reflow may be applied to color PRs 250 to form convex lenses, in accordance with embodiments. Color filters 260 and micro-lenses 260 may be integrated with each other.

In embodiments, since pad passivation layers are etched to form trenches, pad passivation layers do not exist in color filters, which may maximize the sensitivity of light incident through micro-lenses. Since color filters and micro-lenses are simultaneously formed, additional processes for forming micro-lenses may be omitted, which may simplify a manufacturing process.

Embodiments relate to a method of manufacturing CMOS image sensors, in which trenches are formed in pad passivation layers and color filters and micro-lenses are simultaneously formed in the trenches. In embodiments, it may be possible to increase the sensitivity of light incident on light receiving elements and/or simplify manufacturing processes.

It will be apparent to those skilled in the art that various modifications and variations can be made to embodiments. Thus, it is intended that embodiments cover modifications and variations thereof within the scope of the appended claims.

What is claimed is:

1. A method comprising:
   forming at least one passivation layer over a semiconductor substrate;
   forming at least one trench in said at least one passivation layer and said semiconductor substrate; and
   forming an optical element in each of said at least one trench, wherein the optical element comprises a color filter and a micro-lens,
   wherein the color filter and the micro-lens are combined to have a single layer integrated structure.

2. The method of claim 1, wherein said at least one passivation layer comprises a USG passivation layer.

3. The method of claim 1, wherein said at least one passivation layer comprises a d-TEOS passivation layer.

4. The method of claim 1, wherein said at least one passivation layer comprises a SiN passivation layer.

5. The method of claim 1, wherein said at least one trench is formed by forming a photoresist pattern over the at least one passivation layer and etching the at least one passivation layer.

6. The method of claim 5, comprising filling the at least one trench with a color photoresist.

7. The method of claim 6, wherein the color photoresist is formed to be higher than the at least one passivation layer.

8. The method of claim 6, wherein said optical element is formed by reflowing the color photoresist.

9. The method of claim 1, wherein the method is for forming a CMOS image sensor.

10. The method of claim 1, wherein the color filter and the micro-lens are formed of same materials.

11. An apparatus comprising:
at least one passivation layer formed over a semiconductor substrate;
at least one trench formed in said at least one passivation layer and said semiconductor substrate; and
an optical element in each of said at least one trench, wherein the optical element comprises a color filter and a micro-lens,
wherein the color filter and the micro-lens are combined to have a single layer integrated structure.

12. The apparatus of claim 11, wherein said at least one passivation layer comprises a USG passivation layer.

13. The apparatus of claim 11, wherein said at least one passivation layer comprises a d-TEOS passivation layer.

14. The apparatus of claim 11, wherein said at least one passivation layer comprises a SiN passivation layer.

15. The apparatus of claim 11, wherein said at least one trench is formed by forming a photoresist pattern over the at least one passivation layer and etching the at least one passivation layer.

16. The apparatus of claim 15, wherein the at least one trench is filled with a color photoresist.

17. The apparatus of claim 16, wherein the color photoresist is formed to be higher than the at least one passivation layer.

18. The apparatus of claim 16, wherein said optical element is formed by reflowing the color photoresist.

19. The method of claim 11, wherein the apparatus is a CMOS image sensor.

20. The apparatus of claim 11, wherein the color filter and the micro-lens are formed of same materials.

* * * * *